US012755082B2

(12) United States Patent
Liao et al.

(10) Patent No.: US 12,755,082 B2
(45) Date of Patent: Oct. 6, 2026

(54) METHOD AND SYSTEM FOR AUTOMATICALLY CHECKING CIRCUIT LAYOUT OF PRINTED CIRCUIT BOARD

(71) Applicant: USI ELECTRONICS (SHENZHEN) CO., LTD., Shenzhen (CN)

(72) Inventors: Pi-Hsien Liao, Shenzhen (CN); Ming-Yu Cheng, Shenzhen (CN); Ho-Wen Chen, Shenzhen (CN)

(73) Assignee: USI ELECTRONICS (SHENZHEN) CO., LTD., Shenzhen (CN)

( * ) Notice: Subject to any disclaimer, the term of this patent is extended or adjusted under 35 U.S.C. 154(b) by 652 days.

(21) Appl. No.: 18/449,407

(22) Filed: Aug. 14, 2023

(65) Prior Publication Data

US 2024/0289528 A1 Aug. 29, 2024

(30) Foreign Application Priority Data

Feb. 23, 2023 (CN) ........................ 202310173309.X

(51) Int. Cl.
*G06F 30/392* (2020.01)
*G06F 30/3308* (2020.01)
(Continued)

(52) U.S. Cl.
CPC .......... *G06F 30/392* (2020.01); *G06F 30/394* (2020.01); *G06F 30/3308* (2020.01); *G06F 30/367* (2020.01); *G06F 30/398* (2020.01)

(58) Field of Classification Search
CPC .. G06F 30/392; G06F 30/394; G06F 30/3308; G06F 30/367; G06F 30/398
(Continued)

(56) References Cited

U.S. PATENT DOCUMENTS

| | | | | |
|---|---|---|---|---|
| 7,281,232 B1 * | 10/2007 | Nicolino, Jr. | G06F 30/398 716/112 |
| 2006/0200789 A1 * | 9/2006 | Rittman | G06F 30/39 716/52 |
| 2014/0115550 A1 * | 4/2014 | Huang | G06F 30/398 716/112 |

FOREIGN PATENT DOCUMENTS

| | | | |
|---|---|---|---|
| CN | 1704942 A * | 12/2005 | |
| CN | 103778266 A * | 5/2014 | G06F 30/398 |

(Continued)

OTHER PUBLICATIONS

Bai, Chinese Patent Document No. CN-108133103-A, published Jun. 8, 2018, 3 pages including abstract, claims and 1 dr (Year: 2018).*

(Continued)

*Primary Examiner* — Phallaka Kik
(74) *Attorney, Agent, or Firm* — MUNCY, GEISSLER, OLDS & LOWE, P.C.

(57) ABSTRACT

Method and system for automatically checking a circuit layout of a PCB are disclosed. The method includes acquiring routing constraint information in an automatic table format, converting the routing constraint information from the automatic table format into a readable table format and generating routing constraint information in the readable table format, inputting the routing constraint information in the readable table format into a PCB layout software in a plug-in manner for the PCB layout software to acquire a corresponding circuit routing rule, acquiring, after routing ends, a data file outputted by the PCB layout software, and generating a check report by comparing and checking the data file and the routing constraint information. With the method, the constraint information is automatically inputted into the PCB layout software, and a check report is auto- (Continued)

matically generated for correcting errors on a circuit layout in the layout software, to improve circuit layout efficiency.

10 Claims, 6 Drawing Sheets

(51) Int. Cl.
*G06F 30/367* (2020.01)
*G06F 30/394* (2020.01)
*G06F 30/398* (2020.01)

(58) Field of Classification Search
USPC .................... 716/137, 111, 106, 136; 703/16
See application file for complete search history.

(56) References Cited

FOREIGN PATENT DOCUMENTS

| | | | | | |
|---|---|---|---|---|---|
| CN | 104797084 A | * | 7/2015 | ........... H05K 3/0005 |
| CN | 108133103 B | * | 7/2021 | ........... G06F 30/398 |
| CN | 113935271 A | * | 1/2022 | ........... G06F 30/398 |
| TW | 201106184 A | * | 2/2011 | |
| TW | 201528889 A | * | 7/2015 | |
| TW | 202137038 A | * | 10/2021 | ............. H05K 3/341 |
| WO | WO-2020008244 A1 | * | 1/2020 | ........... G06F 30/398 |

OTHER PUBLICATIONS

Chinese Patent Document No. CN-113498272-B, published Nov. 22, 2022, 1 page including abstract. (Year: 2022).*

* cited by examiner

METHOD AND SYSTEM FOR AUTOMATICALLY CHECKING CIRCUIT LAYOUT OF PRINTED CIRCUIT BOARD

BACKGROUND OF THE INVENTION

1. Field of the Invention

The present invention relates to the circuit layout field, and specifically, to a method and system for automatically checking a circuit layout of a printed circuit board (PCB).

2. Description of the Related Art

A PCB is one of the important components in the electronics industry. A PCB is formed by an insulating substrate, connecting traces, and pads for assembling and soldering electronic components, playing both the roles of conductive lines and the insulating substrate. The PCB can replace complex routing to implement electrical connections between components in a circuit. The PCB simplifies the assembly and soldering work of electronic products, reduces routing workload of a conventional wire soldering connection task, and greatly reduces the labor intensity of workers; and reduces machine sizes, reduces product costs, and improves the quality and reliability of electronic devices.

PCBs have good product consistency and can use a standardized design, which is conducive to mechanization and automation in a production process. In addition, an entire assembled and commissioned PCB can be used as an independent spare part, which facilitates the replacement and maintenance of machine products. Therefore, it is very necessary to check the quality of a circuit layout of a PCB by comparing the circuit layout of the PCB with circuit layout rules.

In the existing technology, a circuit designer usually prepares circuit layout constraint information, and then PCB layout member operate layout software to manually enter hundreds of layout rules, so as to compare and check a data file and the circuit layout constraint information, operate and set items one by one according to the content of the circuit layout constraint information, and gather a check report. This approach is time-consuming and is highly prone to human errors.

SUMMARY OF THE INVENTION

To resolve the technical problem that the foregoing manual check of a circuit layout is highly difficult, the present invention provides a method and system for automatically checking a circuit layout of a PCB. Circuit layout constraint information in an automatic table format is converted into a readable table format, which is plugged in to a layout software to implement automatic comparison of circuit layout constraint information and a data file by software to generate a check report.

Specifically, the technical solution of the present invention is as follows.

According to a first aspect, disclosed in the present invention is a method for automatically checking a circuit layout of a PCB, including:

acquiring routing constraint information in an automatic table format;

converting the routing constraint information from the automatic table format into a readable table format, and generating routing constraint information in the readable table format;

inputting the routing constraint information in the readable table format into a PCB layout software in a plug-in manner for the PCB layout software to acquire a corresponding circuit routing rule;

acquiring, after routing ends, a data file outputted by the PCB layout software; and generating a check report by comparing and checking the data file and the routing constraint information.

In some embodiments, the converting the routing constraint information from the automatic table format into a readable table format, and generating routing constraint information in the readable table format specifically includes:

reading the routing constraint information of the automatic table format, and parsing content of an information structure of the routing constraint information;

writing, after the content of the information structure is broken down, the content into a file in a readable table format; and automatically naming each piece of the content in the file in the readable table format respectively, and generating the routing constraint information in the readable table format.

In some embodiments, the writing, after the content of the information structure is broken down, the content into a file in a readable table format specifically includes:

determining whether a structural type of each piece of the content of the information structure needs to be broken down;

if the structural type of the content of the information structure does not need to be broken down, directly writing the content of the information structure into the file in the readable table format; and if the structural type of the content of the information structure needs to be broken down, breaking down the content of the information structure into a plurality pieces of content according to a specific breakdown standard, and writing each piece of that content obtained by breaking down the information structure into the file in the readable table format.

In some embodiments, the acquiring, after routing ends, a data file outputted by the PCB layout software further includes:

acquiring actual values of the data file that are gathered by the PCB layout software, where the actual values include a trace length limit, a trace width limit, a trace spacing, and an electrical coupling distance; and writing the actual values of the data file into the file in the readable table format, and generating data file data of the readable table format.

In some embodiments, the generating a check report by comparing and checking the data file and the routing constraint information includes the following steps:

generating an initial report according to content in the routing constraint information, and writing the data file data and data of the routing constraint information;

comparing and checking the data file data and the data of the routing constraint information, calculating a comparison result and performing marking, and generating the check report; and outputting the check report to help a PCB layout member correct a circuit layout.

In some embodiments, the generating a check report by comparing and checking the data file and the routing constraint information includes: generating a differential non-coupling trace length report by checking whether a length of an uncoupled trace in the data file exceeds a constraint condition in the routing constraint information; generating a differential layer equal-length report by checking whether lengths of coupled traces on each layer in the data file and the routing constraint information are equal; and generating a topological structure-related report by checking a constraint condition related to topological structures in the data file and the routing constraint information.

According to a second aspect, further disclosed in the present invention is a system for automatically checking a circuit layout of a PCB, including:

- a constraint information acquisition module, configured to acquire routing constraint information in an automatic table format;
- a format conversion module, configured to convert the routing constraint information from the automatic table format into a readable table format and generate routing constraint information in the readable table format;
- an information input module, configured to input the routing constraint information in the readable table format into a PCB layout software in a plug-in manner for the PCB layout software to acquire a corresponding circuit routing rule;
- a data file acquisition module, configured to acquire, after routing ends, a data file outputted by the PCB layout software; and
- a report generation module, configured to generate a check report by comparing and checking the data file and the routing constraint information.

In some embodiments, the format conversion module includes:

- a content reading submodule, configured to read the routing constraint information of the automatic table format and parse content of an information structure of the routing constraint information;
- a content breakdown submodule, configured to write, after the content of the information structure is broken down, the content into a file in a readable table format; and
- a content naming submodule, configured to automatically name each piece of the content in the file in the readable table format respectively, and generate the routing constraint information in the readable table format.

In some embodiments, the data file acquisition module further includes:

- a data acquisition submodule, configured to acquire actual values of the data file that are gathered by the PCB layout software, where the actual values include a trace length limit, a trace width limit, a trace spacing, and an electrical coupling distance; and
- a data conversion submodule, configured to write the actual values of the data file into the file in the readable table format and generate data file data of the readable table format.

In some embodiments, the report generation module includes:

- a data writing submodule, configured to generate an initial report according to content in the routing constraint information and write the data file data and data of the routing constraint information;
- a comparison and check submodule, configured to compare and check the data file data and the data of the routing constraint information, calculate a comparison result and perform marking, and generate the check report; and
- a report output submodule, configured to output the check report to help a PCB layout member correct a circuit layout.

In some embodiments, the generating a check report by comparing and checking the data file and the routing constraint information includes: generating a differential non-coupling trace length report by checking whether a length of an uncoupled trace in the data file exceeds a constraint condition in the routing constraint information; generating a differential layer equal-length report by checking whether lengths of coupled traces on each layer in the data file and the routing constraint information are equal; and generating a topological structure-related report by checking a constraint condition related to topological structures in the data file and the routing constraint information.

Compared with the prior art, the present invention has at least one of the following beneficial effects:

1. PCB design is a very complex process because there are many tiny connecting traces and electrical components on a multilayer board. When checking such a large number of components, even very skilled professionals make mistakes inevitably. In the present invention, circuit routing constraint information is converted from an automatic table format into a readable table format to automatically compare a data file for checking to generate a report. This saves labor, reduces labor consumption, reduces human errors, and speeds up the checking of a circuit layout of a PCB, thereby improving production efficiency.
2. After automatically comparing and checking a data file and routing constraint information, software generates a report according to content of the routing constraint information, and marks unqualified parts in the check report to facilitate the correction of circuit layout problems. A circuit board with an accurate layout can improve the quality of related products, and minimize problems in a subsequent product application process.

BRIEF DESCRIPTION OF THE DRAWINGS

Preferred embodiments are described below with reference to the accompanying drawings to further describe the above features, technical characteristics, advantages, and implementations of the present invention in a clear and understandable manner.

DETAILED DESCRIPTION OF THE INVENTION

Figure 1:
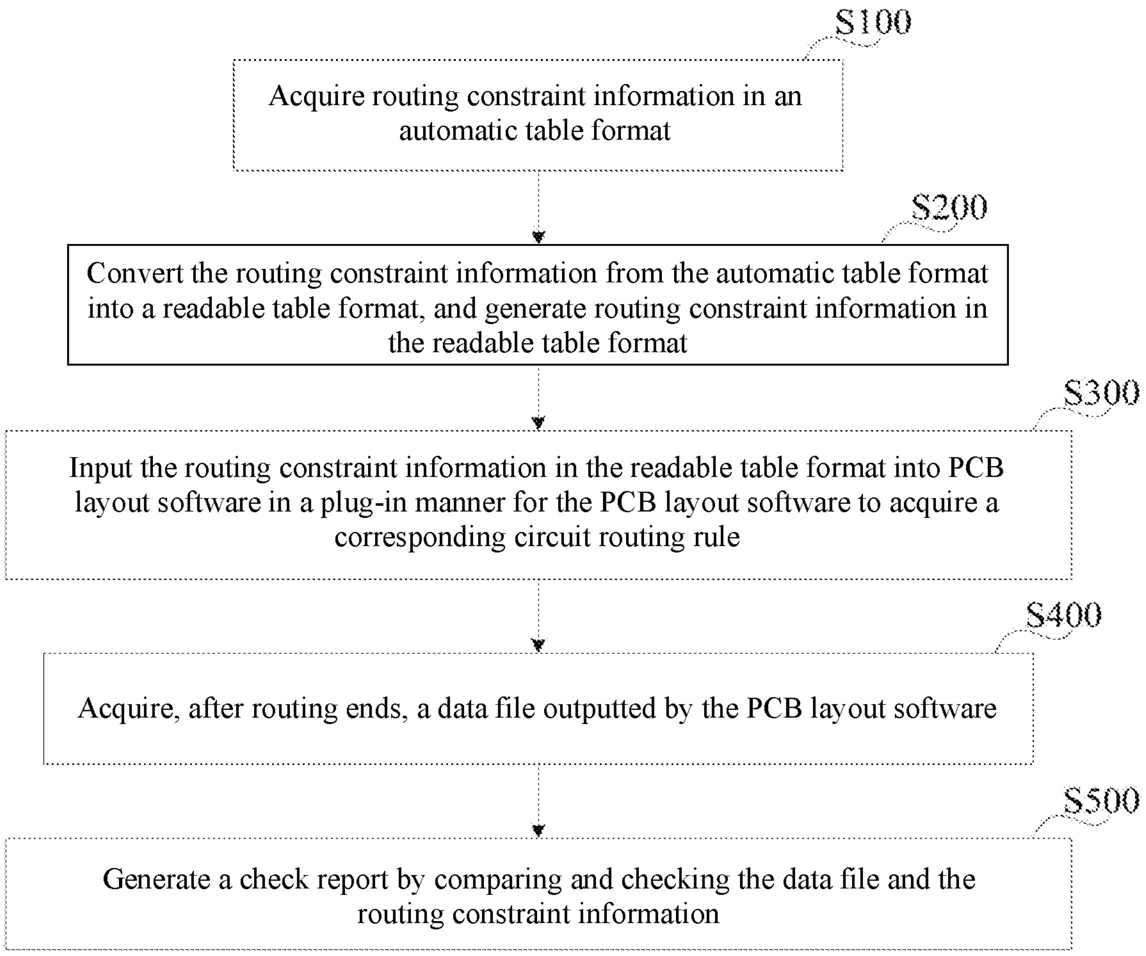
FIG. 1 is a flowchart of a method for automatically checking a circuit layout of a PCB according to an embodiment of the present invention.

In the following description, specific details such as particular system structures, techniques, and the like are presented for the purpose of description rather than limitation, in order to provide a thorough understanding of embodiments of this application. However, it should be clear to those skilled in the art that this application can be implemented in other embodiments without these specific details. In other cases, detailed descriptions of well-known systems, apparatuses, circuits, and methods are omitted so that unnecessary details do not hinder the description of this application.

It should be understood that during use in this specification and the appended claims, the term "comprise" specifies the presence of described features, integers, steps, operations, elements and/or components, but do not preclude the presence or addition of one or more other features, integers, steps, operations, elements, components and/or sets thereof.

For brevity of the drawings, only the parts related to the invention are schematically represented in the respective drawings; they do not represent their actual structure as a product. In addition, to make the drawings simple and easy to understand, in some drawings, for components with the same structure or function, only one of them is schematically drawn, or only one of them is indicated. In this article, "one" not only means "only one", but also means "more than one".

It should be further understood that the term "and/or" as used in the specification of this application and the appended claims refers to any and all possible combinations of one or more of the items listed in connection therewith, and includes such combinations.

It needs to be noted herein that unless otherwise expressly specified and defined, "mounted", "connected", and "connection", should be understood in a broad sense, for example, fixedly connected, detachably connected or integrally connected; or mechanically connected or electrically connected; or connected directly or indirectly through an intermediate, or two elements communicated internally. For a person of ordinary skill in the art, specific meanings of the terms in the present invention should be understood according to specific conditions.

In specific embodiments, a terminal device described in embodiments of this application includes, but is not limited to, another portable device such as a mobile phone, a laptop, a homeschooling device, or a tablet computer having a touch-sensitive surface (for example, a touch screen display and/or a touch pad). It should also be understood that in some embodiments, the terminal device is not a portable communication device, but instead is a desktop computer having a touch-sensitive surface (for example, a touch screen display and/or a touch pad).

In addition, in the description of the present application, the terms "first", "second", and the like are only used only for distinguishing between descriptions but are not intended to indicate or imply relative importance.

To describe the technical solutions in embodiments of the present invention or the prior art more clearly, specific embodiments of the present invention are described below with reference to the accompanying drawings. Apparently, the accompanying drawings in the following description show only some embodiments of the present invention, and a person of ordinary skill in the art may still derive other drawings from these accompanying drawings without creative efforts, and derive other embodiments.

Referring to FIG. 1, an embodiment of a method for automatically checking a circuit layout of a PCB provided in the present invention includes the following steps.

S100: Acquire routing constraint information in an automatic table format.

Specifically, a datasheet in a PDF format related to a circuit layout is manually sorted. Net list information extracted from a principle diagram of the circuit layout is manually sorted. The datasheet in the PDF format and the net list information are jointly referred to as constraint information of the circuit layout of the PCB. The constraint information is converted into the automatic table format. A process of the information conversion needs to be manually performed. Structural analysis is first performed on content of the constraint information and sorting is performed to obtain the automatic table format. The automatic table format is a high-level language, easy-to-understand, and easy-to-review format. The constraint information in the automatic table format better facilitates processing by a computer.

S200: Convert the routing constraint information from the automatic table format into a readable table format, and generate routing constraint information in the readable table format.

Specifically, the automatic table format is an Auto table, and is a high-level easy-to-understand and easy-to-review format compared with a readable table format, that is, a CM table. Information of the CM table is in a plug-in acceptable format. Content of the CM table is in a representation manner close to that of the PCB layout software, and is a set of individual rules, including rule names and detailed information of rules.

S300: Input the routing constraint information in the readable table format into PCB layout software in a plug-in manner for the PCB layout software to acquire a corresponding circuit routing rule.

Specifically, a plug-in is used in the PCB layout software, and the constraint information in the readable table format is automatically inputted into the PCB layout software. After the input is completed, the constraint information can be viewed in the PCB layout software.

S400: Acquire, after routing ends, a data file outputted by the PCB layout software.

Specifically, after routing by the PCB layout software ends, actual values of the data file gathered by the PCB layout software include a routing length; a routing width; a spacing, that is, a distance between traces; coupling, that is, a distance between parallel traces; a quantity of through holes; a quantity of blind holes; and the like.

S500: Generate a check report by comparing and checking the data file and the routing constraint information.

Specifically, after routing by the PCB layout software ends, an actual value structure of the data file gathered by the PCB layout software is referred to as an information structure A. The information structure is a map. A key value is each net. Content is an actual length value.

A content structure of the constraint information in the automatic table format is referred to as an information structure B.

A report is compiled according to an actual content list of the information structure B. Each net is considered as a key value, and the actual length value is extracted from the information structure A.

A constraint value and an actual length value of each net are filled in the report, and a length value of Pass/Fail is filled in the report.

Figure 2:
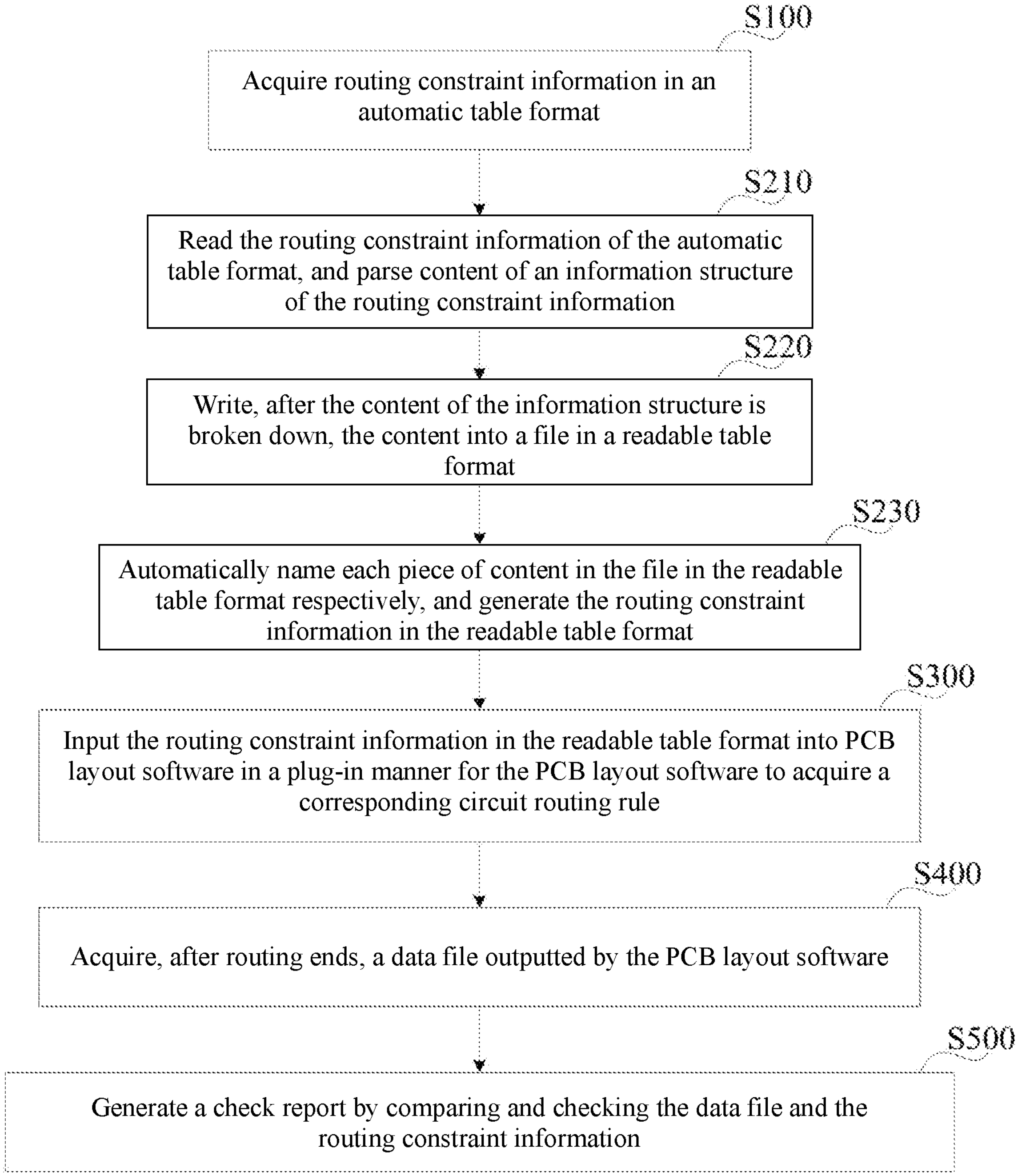
FIG. 2 is a flowchart of a method for automatically checking a circuit layout of a PCB according to another embodiment of the present invention.

A method for automatically checking a circuit layout of a PCB according to another embodiment of the present invention is shown in FIG. 2. Based on S200 of converting the routing constraint information from the automatic table format into a readable table format, and generating routing constraint information in the readable table format in an embodiment of the foregoing method, the method further includes the following steps.

S210: Read the routing constraint information of the automatic table format, and parse content of an information structure of the routing constraint information.

Specifically, a program automatically parses information content, which is faster and more convenient compared with manual input, thereby improving input efficiency and at the same time improving accuracy.

S220: Write, after the content of the information structure is broken down, the content into a file in a readable table format.

Specifically, information obtained through conversion is constraint information in a CM table format. An information structure is a map. A key value is the first net. Specific content is a constraint value and a list structure of the net. When content of the information structure is a bus, the content is decomposed into a net. Specific content is a constraint value and a list structure of a net, which are sequentially filled.

S230: Automatically name each piece of content in the file in the readable table format respectively, and generate the routing constraint information in the readable table format.

Specifically, after the content of the information structure is decomposed and filled in a CM table, the content has a representation manner close to that of the PCB layout software, and is a set of individual rules. A rule name needs to be automatically generated for each rule.

In another embodiment of the present invention, S220 of writing, after the content of the information structure is broken down, the content into a file in a readable table format specifically further includes the following steps.

S220: Determine whether a structural type of each piece of content of the information structure needs to be broken down.

Specifically, when it is determined that the information structure is a map, the information structure does not need to be broken down. When the content of the information structure is a bus, the information structure needs to be broken down.

S220: If the structural type of the content of the information structure does not need to be broken down, directly write the content of the information structure into the file in the readable table format.

S220: If the structural type of the content of the information structure needs to be broken down, break down the content of the information structure into a plurality pieces of content according to a specific breakdown standard, and write each piece of content obtained by breaking down the information structure into the file in the readable table format.

Specifically, in a comprehensible language, a large part is divided into a plurality of small parts, and the small parts are sequentially filled in the table. For example, P3E_PCH_SW_RX_DN[0 . . . 14] is decomposed into a total of 15 small pieces of content from P3E_PCH_SW_RX_DN0 to P3E_PCH_SW_RX_DN14.

Figure 3:
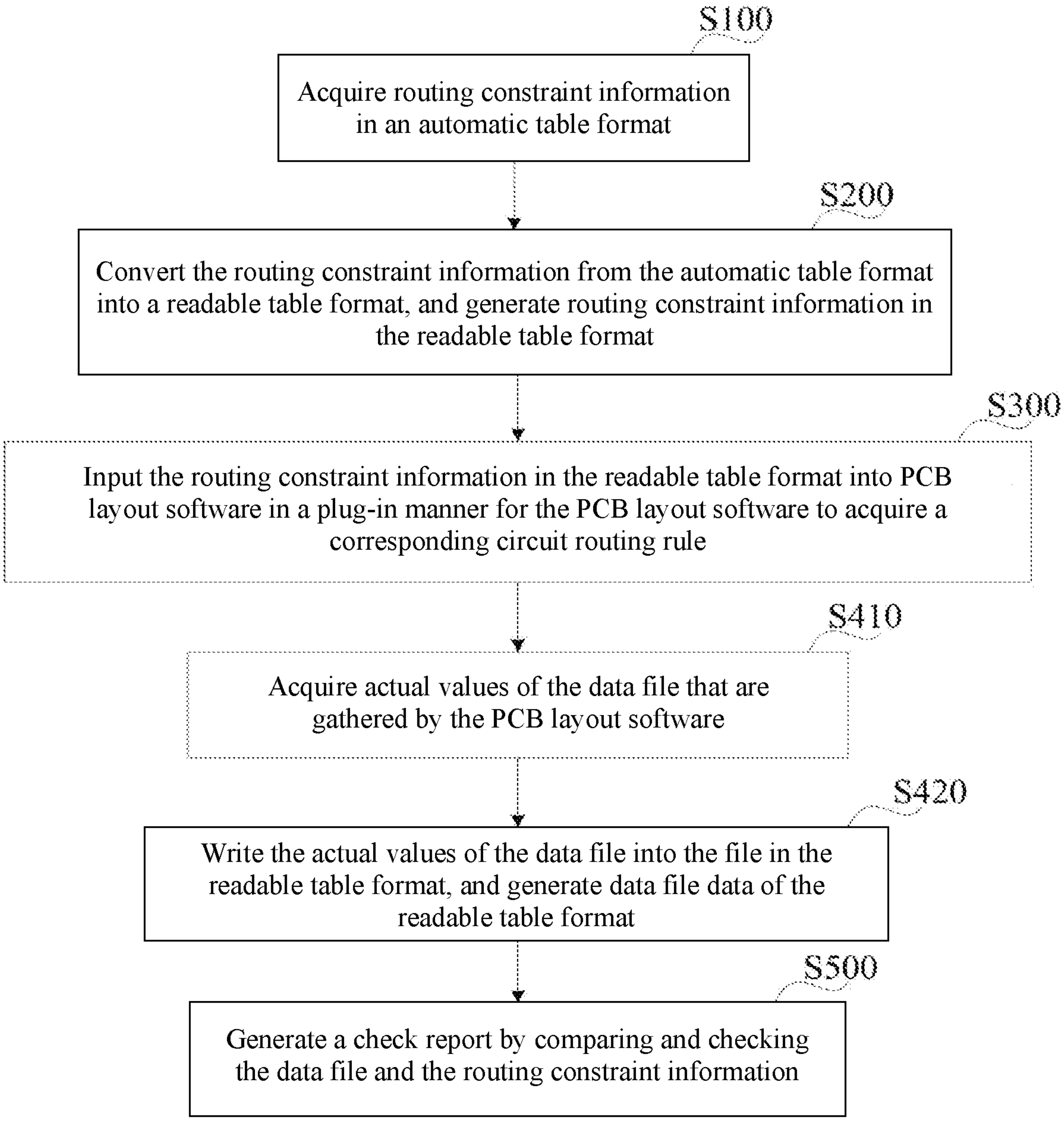
FIG. 3 is a flowchart of a method for automatically checking a circuit layout of a PCB according to still another embodiment of the present invention.

A method for automatically checking a circuit layout of a PCB according to another embodiment of the present invention is shown in FIG. 3. Based on S400 of acquiring, after routing ends, a data file outputted by the PCB layout software in an embodiment of the foregoing method, the method includes the following steps.

S410: Acquire actual values of the data file that are gathered by the PCB layout software, where the actual values include a trace length limit, a trace width limit, a trace spacing, and an electrical coupling distance.

Specifically, the actual values further include other parameters, for example, a quantity of through holes; a quantity of blind holes; and the like.

S420: Write the actual values of the data file into the file in the readable table format, and generate data file data of the readable table format.

Specifically, after the actual values of the data file are gathered by the PCB layout software, the actual values are sorted in actual data information in the readable table format. The information structure is a map. A key value is each net. Content is actual values of the data file.

Figure 4:
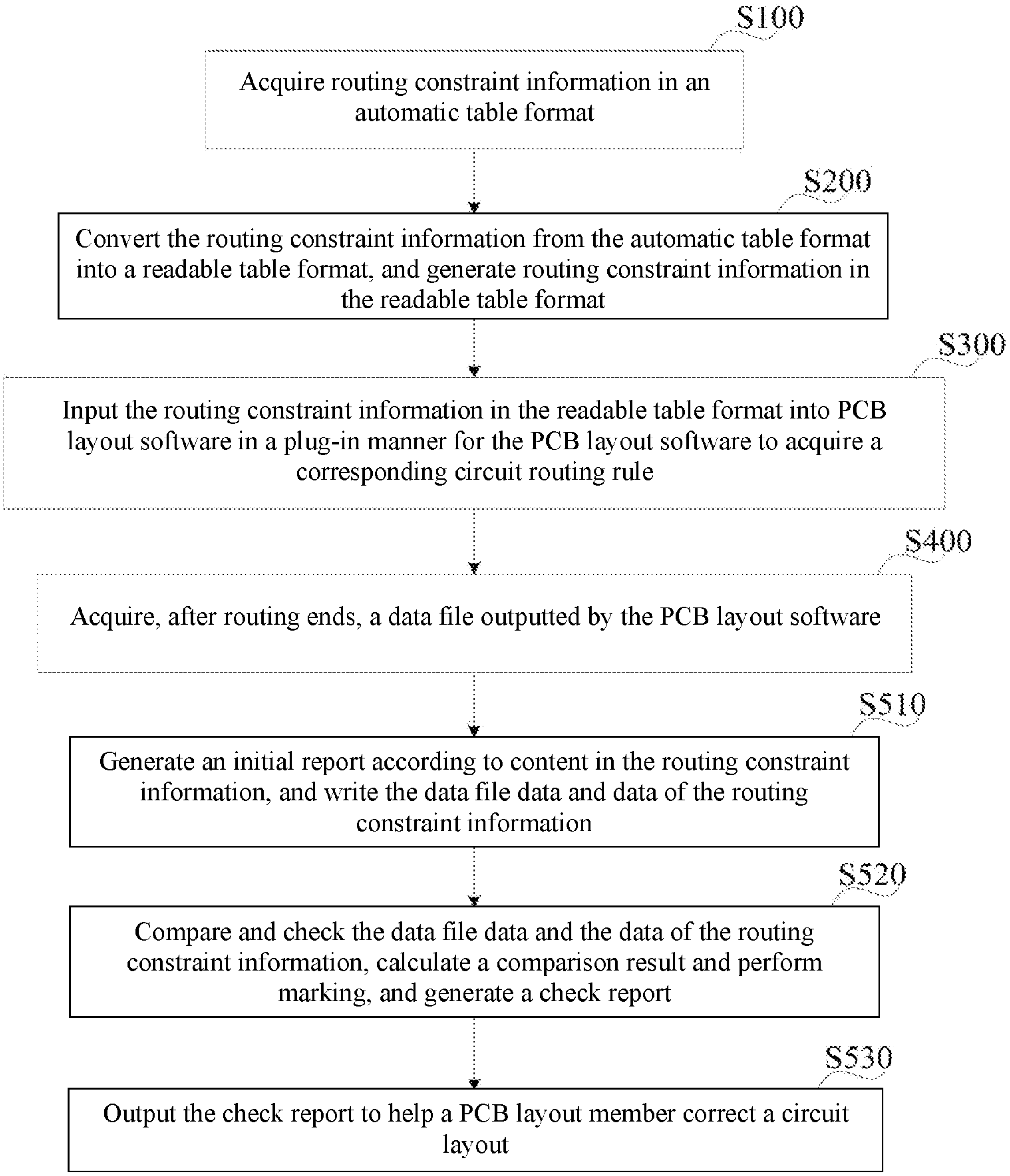
FIG. 4 is a flowchart of a method for automatically checking a circuit layout of a PCB according to still another embodiment of the present invention.

A method for automatically checking a circuit layout of a PCB according to another embodiment of the present invention is shown in FIG. 4. Based on S500 of generating a check report by comparing and checking the data file and the routing constraint information, the method includes the following steps.

S510: Generate an initial report according to content in the routing constraint information, and write the data file data and data of the routing constraint information.

Specifically, for convenient differentiation, an actual data information structure in the readable table format is referred to as the information structure A. The constraint information in the automatic table format is referred to as the information structure B. A report is compiled according to an actual content list of the information structure B. Each net is considered as a key value, and the actual length value is extracted from the information structure A. A constraint value and an actual length value of each net are filled in the report, and a length value of Pass/Fail is filled in the report.

S520: Compare and check the data file data and the data of the routing constraint information, calculate a comparison result and perform marking, and generate the check report.

Specifically, data of the information structure A is compared with data of the information structure B. Corresponding processing is performed according to a requirement of the report. After comparison ends, qualified or unqualified items are marked with different colors. An outputted report is more intuitive, so as to adjust and optimize the routing of the board.

S530: Output the check report to help a PCB layout member correct a circuit layout.

In another embodiment of the present invention, the generating a check report by comparing and checking the data file and the routing constraint information includes generating a differential non-coupling trace length report by checking whether a length of an uncoupled trace in the data file exceeds a constraint condition in the routing constraint information, generating a differential layer equal-length report by checking whether lengths of coupled traces on each layer in the data file and the routing constraint information are equal, and generating a topological structure-related report by checking a constraint condition related to topological structures in the data file and the routing constraint information.

Figure 5:
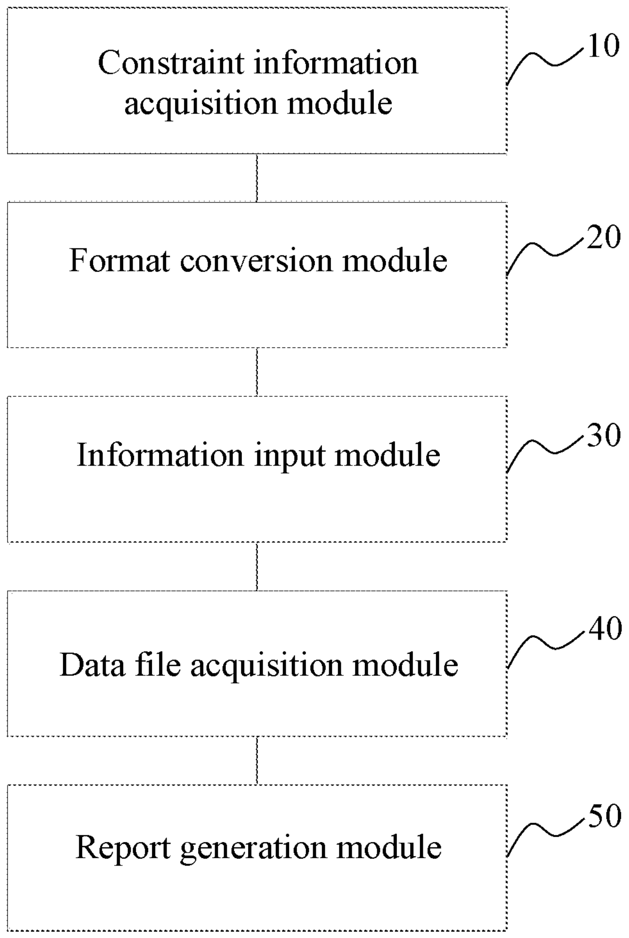
FIG. 5 is a structural block diagram of a system for automatically checking a circuit layout of a PCB according to still another embodiment of the present invention.

Based on the same technical conception, further disclosed in the present invention is a system for automatically checking a circuit layout of a PCB. The system may be implemented by using any foregoing embodiment of the method for automatically checking a circuit layout of a PCB. Specifically, as shown in FIG. 5, a system for automatically checking a circuit layout of a PCB according to an embodiment of the present invention includes a constraint information acquisition module 10, a format conversion module 20, an information input module 30, a data file acquisition module 40, and a report generation module 50.

The constraint information acquisition module 10 is configured to acquire routing constraint information in an automatic table format.

Specifically, a datasheet in a PDF format related to a circuit layout is manually sorted. Net list information extracted from a principle diagram of the circuit layout is manually sorted. The datasheet and the net list information are jointly referred to as constraint information of the circuit layout of the PCB. The constraint information is converted into the automatic table format. A process of the information conversion needs to be manually performed. Structural analysis is first performed on content of the constraint information and sorting is performed to obtain the automatic table format. The automatic table format is a high-level language, easy-to-understand, and easy-to-review format. The constraint information in the automatic table format better facilitates processing by a computer.

The format conversion module 20 is configured to convert the routing constraint information from the automatic table format into a readable table format, and generate routing constraint information in the readable table format.

Specifically, the automatic table format is an Auto table, and is a high-level easy-to-understand and easy-to-review format compared with a readable table format, that is, a CM table. Information of the CM table is in a plug-in acceptable format. Content of the CM table is in a representation manner close to that of the PCB layout software, and is a set of individual rules, including rule names and detailed information of rules.

The information input module 30 is configured to input the routing constraint information in the readable table format into PCB layout software in a plug-in manner for the PCB layout software to acquire a corresponding circuit routing rule.

Specifically, a plug-in is used in the PCB layout software, and the constraint information in the readable table format is automatically inputted into the PCB layout software. After the input is completed, the constraint information can be viewed in the PCB layout software.

The data file acquisition module 40 is configured to acquire, after routing ends, a data file outputted by the PCB layout software.

Specifically, after routing by the PCB layout software ends, actual values of the data file gathered by the PCB layout software include a routing length; a routing width; a spacing, that is, a distance between traces; coupling, that is, a distance between parallel traces; a quantity of through holes; a quantity of blind holes; and the like.

The report generation module 50 is configured to generate a check report by comparing and checking the data file and the routing constraint information.

Specifically, after routing by the PCB layout software ends, an actual value structure of the data file gathered by the PCB layout software is referred to as an information structure A. The information structure is a map. A key value is each net. Content is an actual length value.

A content structure of the original constraint information, i.e., the constraint information in the automatic table format, is referred to as an information structure B.

A report is compiled according to an actual content list of the information structure B. Each net is considered as a key value, and the actual length value is extracted from the information structure A.

A constraint value and an actual length value of each net are filled in the report, and a length value of Pass/Fail is filled in the report.

Figure 6:
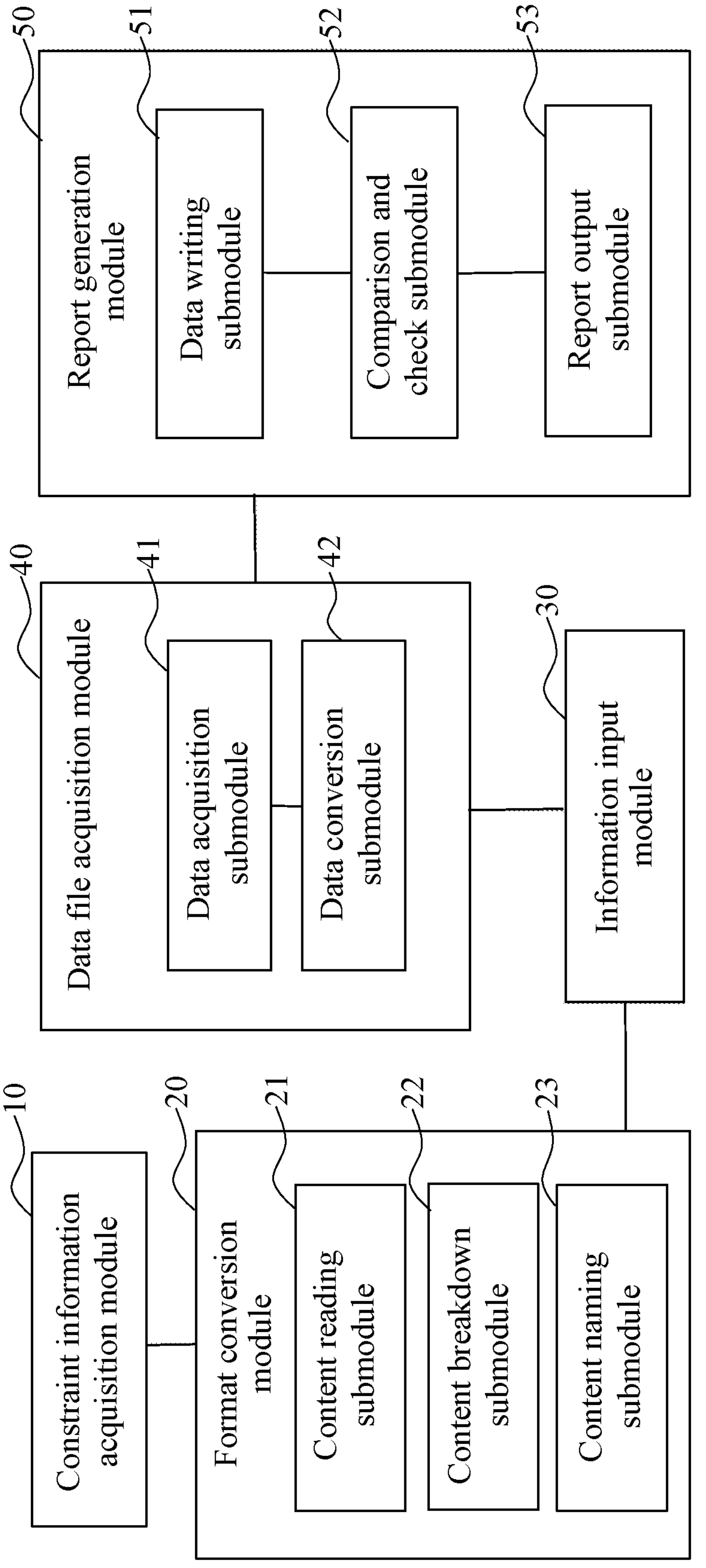
FIG. 6 is a structural block diagram of a system for automatically checking a circuit layout of a PCB according to still another embodiment of the present invention.

A system for automatically checking a circuit layout of a PCB according to another embodiment of the present invention is shown in FIG. 6. Based on the foregoing system of the above-mentioned embodiment, the format conversion module 20 further includes a content reading submodule 21, a content breakdown submodule 22, and a content naming submodule 23.

The content reading submodule 21 is configured to read the routing constraint information of the automatic table format, and parse content of an information structure of the routing constraint information.

Specifically, a program automatically parses information content, which is faster and more convenient compared with manual input, thereby improving input efficiency and at the same time improving accuracy.

The content breakdown submodule 22 is configured to write, after the content of the information structure is broken down, the content into a file in a readable table format.

Specifically, information obtained through conversion is constraint information in a CM table format. An information structure is a map. A key value is the first net. Specific content is a constraint value and a list structure of the net. When content of the information structure is a bus, the content is decomposed into a net. Specific content is a constraint value and a list structure of a net, which are sequentially filled.

The content naming submodule 23 is configured to automatically name each piece of content in the file in the readable table format respectively, and generate the routing constraint information in the readable table format.

Specifically, after the content of the information structure is decomposed and filled in a CM table. Content has a representation manner close to that of the PCB layout software, and is a set of individual rules. A rule name needs to be automatically generated for each rule.

A system for automatically checking a circuit layout of a PCB according to another embodiment of the present invention is further disclosed hereinafter. Based on the foregoing system of the above-mentioned embodiment, the data file acquisition module 40 further includes a data acquisition submodule 41 and a data conversion submodule 42.

The data acquisition submodule 41 is configured to acquire actual values of the data file that are gathered by the PCB layout software, where the actual values include a trace length limit, a trace width limit, a trace spacing, and an electrical coupling distance.

The data conversion submodule 42 is configured to write the actual values of the data file into the file in the readable table format, and generate data file data of the readable table format.

Specifically, after the actual values of the data file are gathered by the PCB layout software, the actual values are sorted in actual data information in the readable table format. The information structure is a map. A key value is each net. Content is actual values of the data file.

A system for automatically checking a circuit layout of a PCB according to another embodiment of the present invention is disclosed hereinafter. Based on the foregoing system of the above-mentioned embodiment, the report generation module 50 includes a data writing submodule 51, a comparison and check submodule 52, and a report output submodule 53.

The data writing submodule 51 is configured to generate an initial report according to content in the routing constraint information, and write the data file data and data of the routing constraint information.

Specifically, for convenient differentiation, an actual data information structure in the readable table format is referred to as the information structure A. The constraint information in the automatic table format is referred to as the information structure B. A report is compiled according to an actual content list of the information structure B. Each net is considered as a key value, and the actual length value is extracted from the information structure A. A constraint value and an actual length value of each net are filled in the report, and a length value of Pass/Fail is filled in the report.

The comparison and check submodule 52 is configured to compare and check the data file data and the data of the routing constraint information, calculate a comparison result and perform marking, and generate the check report.

Specifically, data of the information structure A is compared with data of the information structure B. Corresponding processing is performed according to a requirement of the report. After comparison ends, qualified or unqualified items are marked with different colors. An outputted report is more intuitive, so as to adjust and optimize the routing of the board.

The report output submodule 53 is configured to output the check report to help a PCB layout member correct a circuit layout.

In another embodiment of the present invention, the generating a check report by comparing and checking the data file and the routing constraint information includes generating a differential non-coupling trace length report by checking whether a length of an uncoupled trace in the data file exceeds a constraint condition in the routing constraint information, generating a differential layer equal-length report by checking whether lengths of coupled traces on each layer in the data file and the routing constraint information are equal, and generating a topological structure-related report by checking a constraint condition related to topological structures in the data file and the routing constraint information.

The method and system for automatically checking a circuit layout of a PCB of the present invention have the same technical conception. Technical details in embodiments of the method and system are applicable to each other. To reduce repetition, details are not described again.

The present invention is described with reference to the flowcharts and/or block diagrams of the method, the device (system), and the computer program product according to the embodiments of the present invention. It should be understood that computer program commands may be used to implement each process and/or each block in the flowcharts and/or the block diagrams and a combination of a process and/or a block in the flowcharts and/or the block diagrams. The computer program commands may be provided for a general-purpose computer, a dedicated computer, an embedded processor, or a processor of another programmable data processing device to generate a machine, so that the commands executed by the computer or the processor of the another programmable data processing device generate an apparatus for implementing a specific function in one or more procedures in the flowcharts and/or in one or more blocks in the block diagrams.

These computer program commands may be stored in a computer readable memory that can instruct the computer or any other programmable data processing device to work in a specific manner, so that the commands stored in the computer readable memory generate an article that includes a command apparatus. The command apparatus implements a specific function in one or more processes in the flowcharts and/or in one or more blocks in the block diagrams.

The computer program commands may alternatively be loaded onto a computer or another programmable data processing device, so that a series of operations and steps are performed on the computer or the another programmable device, so that computer-implemented processing is generated. Therefore, the instructions executed on the computer or the another programmable device provide steps for implementing a specific function in one or more procedures in the flowcharts and/or in one or more blocks in the block diagrams.

Although preferred embodiments of the present disclosure are described, once acquiring basic innovative concepts, a person skilled in the art may make other changes and modifications to these embodiments. Therefore, the appended claims intend to be explained to include preferred embodiments and all changes and modifications that fall within the scope of the present disclosure.

Obviously, persons skilled in the art can make various modifications and variations to the present invention without departing from the spirit and scope of the present invention. In this way, if these modifications and variations to the present invention fall within the scope of claims of the present invention and equivalent technologies thereof, the present invention also intends to cover these modifications and variations.

What is claimed is:

1. A method for automatically checking a circuit layout of a printed circuit board (PCB), comprising the following steps:

acquiring routing constraint information in an automatic table format;

converting the routing constraint information from the automatic table format into a readable table format, and generating routing constraint information in the readable table format;

inputting the routing constraint information in the readable table format into a PCB layout software in a plug-in manner for the PCB layout software to acquire a corresponding circuit routing rule;

acquiring, after routing ends, a data file outputted by the PCB layout software; and generating a check report by comparing and checking the data file and the routing constraint information.

2. The method as claimed in claim 1, wherein the step of converting the routing constraint information from the automatic table format into the readable table format and generating the routing constraint information in the readable table format comprises:

reading the routing constraint information of the automatic table format, and parsing content of an information structure of the routing constraint information;

writing, after the content of the information structure is broken down, the content into a file in a readable table format; and automatically naming each piece of the content in the file in the readable table format respectively, and generating the routing constraint information in the readable table format.

3. The method as claimed in claim 2, wherein the writing, after the content of the information structure is broken down, the content into the file in the readable table format comprises:

determining whether a structural type of each piece of the content of the information structure needs to be broken down;

if the structural type of the content of the information structure does not need to be broken down, directly writing the content of the information structure into the file in the readable table format; and if the structural type of the content of the information structure needs to be broken down, breaking down the content of the information structure into a plurality pieces of content according to a specific breakdown standard, and writing each piece of the content obtained by breaking down the information structure into the file in the readable table format.

4. The method as claimed in claim 1, wherein the step of acquiring, after routing ends, the data file outputted by the PCB layout software comprises:

acquiring actual values of the data file that are gathered by the PCB layout software, wherein the actual values comprise a trace length limit, a trace width limit, a trace spacing, and an electrical coupling distance; and writing the actual values of the data file into the file in the readable table format, and generating data file data of the readable table format.

5. The method as claimed in claim 1, wherein the step of generating the check report by comparing and checking the data file and the routing constraint information comprises:

generating an initial report according to content in the routing constraint information, and writing data file data and data of the routing constraint information;

comparing and checking the data file data and the data of the routing constraint information, calculating a comparison result and performing marking, and generating the check report; and outputting the check report for correcting a circuit layout.

6. The method as claimed in claim 5, wherein the step of generating the check report by comparing and checking the data file and the routing constraint information comprises:

generating a differential non-coupling circuit length report by checking whether a length of an uncoupled trace in the data file exceeds a constraint condition in the routing constraint information;

generating a differential layer equal-length report by checking whether lengths of coupled traces on each layer in the data file and the routing constraint information are equal; and generating a topological structure-related report by checking a constraint condition related to topological structures in the data file and the routing constraint information.

7. A system for automatically checking a circuit layout of a printed circuit board (PCB), comprising:

a constraint information acquisition module, configured to acquire routing constraint information in an automatic table format;

a format conversion module, configured to convert the routing constraint information from the automatic table format into a readable table format and generate routing constraint information in the readable table format;

an information input module, configured to input the routing constraint information in the readable table format into a PCB layout software in a plug-in manner for the PCB layout software to acquire a corresponding circuit routing rule;

a data file acquisition module, configured to acquire, after routing ends, a data file outputted by the PCB layout software; and a report generation module, configured to generate a check report by comparing and checking the data file and the routing constraint information.

8. The system as claimed in claim 7, wherein the format conversion module comprises:

a content reading submodule, configured to read the routing constraint information of the automatic table format and parse content of an information structure of the routing constraint information;

a content breakdown submodule, configured to write, after the content of the information structure is broken down, the content into a file in a readable table format; and a content naming submodule, configured to automatically name each piece of the content in the file in the readable table format respectively and generate the routing constraint information in the readable table format.

9. The system as claimed in claim 7, wherein the data file acquisition module comprises:

a data acquisition submodule, configured to acquire actual values of the data file that are gathered by the PCB layout software, wherein the actual values comprise a trace length limit, a trace width limit, a trace spacing, and an electrical coupling distance; and a data conversion submodule, configured to write the actual values of the data file into the file in the readable table format, and generate data file data of the readable table format.

10. The system as claimed in claim 7, wherein the report generation module comprises:

a data writing submodule, configured to generate an initial report according to content in the routing constraint information and write data file data and data of the routing constraint information;

a comparison and check submodule, configured to compare and check the data file data and the data of the routing constraint information, calculate a comparison result and perform marking, and generate the check report; and a report output submodule, configured to output the check report for correcting a circuit layout.

* * * * *